| United States Patent [19] | [11] | 4,451,746 |
|---|---|---|
| Hirose et al. | [45] | May 29, 1984 |

[54] NON-LINEAR EMPHASIS CIRCUIT

[75] Inventors: Koichi Hirose, Katsuta; Kazuo Kondo, Yokohama, both of Japan

[73] Assignee: Hitachi, Ltd., Tokyo, Japan

[21] Appl. No.: 279,811

[22] Filed: Jul. 2, 1981

[30] Foreign Application Priority Data

Jul. 4, 1980 [JP] Japan .................................. 55-90528

[51] Int. Cl.³ .......................... H03B 1/04; G06G 7/12
[52] U.S. Cl. .................................. 307/494; 307/542; 330/149; 333/14; 358/340
[58] Field of Search .................. 307/494, 542; 333/14; 330/124, 136, 149; 358/315, 327, 340; 369/88

[56] References Cited

U.S. PATENT DOCUMENTS

| 3,445,681 | 5/1969 | Cattermole et al. | 307/494 |
| 3,815,039 | 6/1974 | Fujisawa | 330/149 |
| 3,980,964 | 9/1976 | Grodinsky | 330/136 |
| 4,200,889 | 4/1980 | Strobele | 333/14 |

Primary Examiner—Stanley D. Miller
Assistant Examiner—B. P. Davis
Attorney, Agent, or Firm—Antonelli, Terry & Wands

[57] ABSTRACT

A non-linear emphasis circuit comprising a high-pass filter receiving an input signal, a compressor processing the output of the filter with such a variable gain as to decrease or increase responsive to an increase or a decrease of the output of the filter and an adder for adding the input signal and the output of the compressor at a predetermined rate for producing a non-linearly emphasized signal. The circuit has a structure adapted for production in an IC form and easy to design.

11 Claims, 11 Drawing Figures

F I G. 10
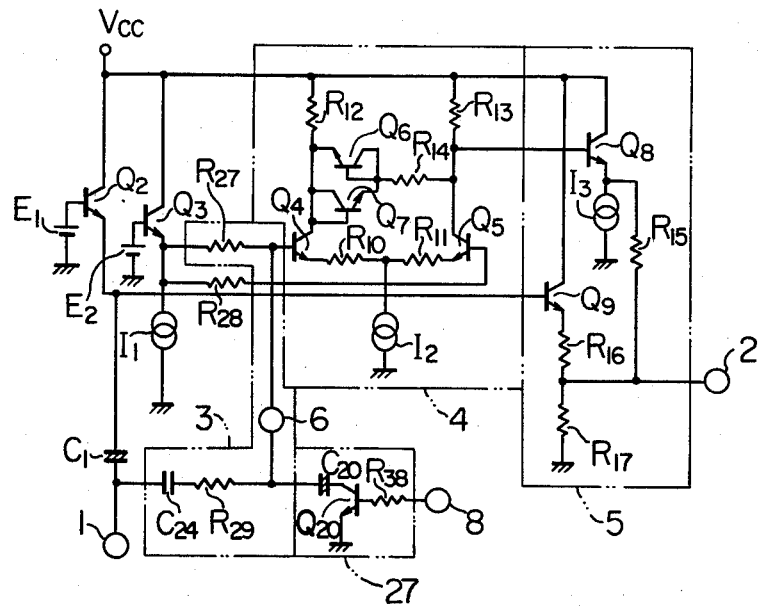
F I G. 11
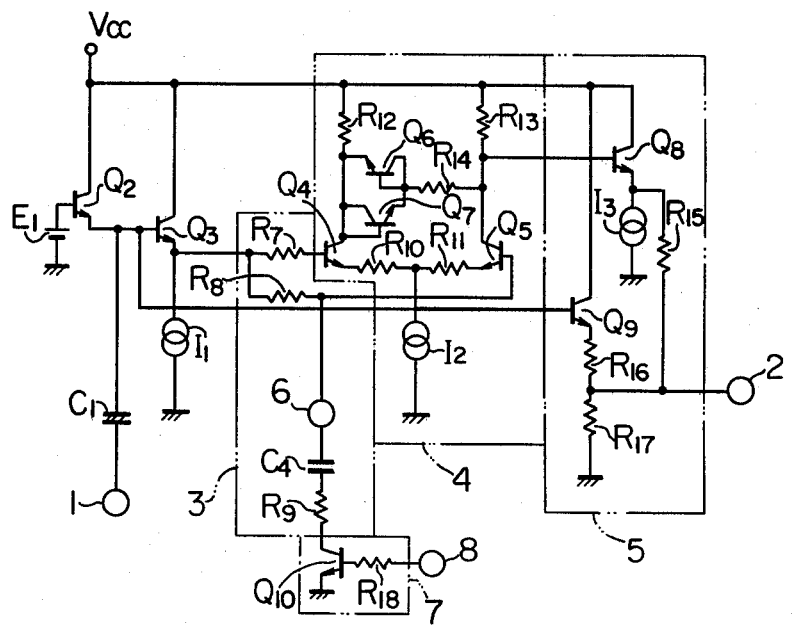

NON-LINEAR EMPHASIS CIRCUIT

BACKGROUND OF THE INVENTION

This invention relates to a non-linear emphasis circuit that is incorporated in a home-use magnetic video tape recording and reproducing apparatus (hereinafter simply referred to as a VTR) for the sake of improving the signal-to-noise ratio.

Since, in the home-use VTR, it is demanded that as long a time as possible is provided for recording with a single magnetic tape, many home-use VTRs are designed to be operable, in addition to in a normal recording mode, in a long time recording mode using decreased width recording tracks.

However, the signal-to-noise ratio is degraded more in the long time recording mode than in a normal recording mode because of the reduced width. Therefore, it is a widespread expedient for improvement of the signal-to-noise ratio to exert a so-called non-linear emphasis in which the degree of emphasis is variable with the input level in the long time recording mode, in addition to a fixed emphasis exerted in the normal recording mode.

A prior art non-linear emphasis circuit, as will be described later with reference to the accompanying drawings, includes elements which participate in substantial determination of the frequency response of the circuit and hence are required to have highly accurate constants, but the circuit arrangement of these elements is unsuitable for production of the circuit in an IC form. Further, the prior art non-linear emphasis circuit also includes a switching circuit adapted to bypass the non-linear emphasis circuit to obtain a non-emphasized signal in the normal recording mode but this switching circuit has a complicated structure as will be described later.

SUMMARY OF THE INVENTION

An object of this invention is to provide a non-linear emphasis circuit having a structure adapted for production in an IC form with a small number of pins and a small number of peripheral parts.

Another object of this invention is to provide a non-linear emphasis circuit which is relatively easy in designing the frequency characteristics and which includes a switching circuit of a simple structure.

According to a major feature of the invention, an input signal is applied to a high-pass filter, the output of the filter is processed at a compressor with such a variable gain as to increase or decrease responsive to a decrease or an increase of the input level, and the output of the compressor and the input signal are added at an adder, so that desired emphasis characteristics can be obtained responsive to the level of the input signal.

According to another feature of the invention, a circuit section participating in determination of the frequency response or of the frequency characteristics does not include non-linear elements.

BRIEF DESCRIPTION OF THE DRAWINGS

FIGS. 9 through 11 are circuit diagrams showing practical constructions of embodiments of the invention.

DESCRIPTION OF THE PREFERRED EMBODIMENTS

For a better understanding of the present invention, the aforementioned inconveniences of the prior art will be described in detail with reference to FIGS. 1 to 3.

Figure 1:
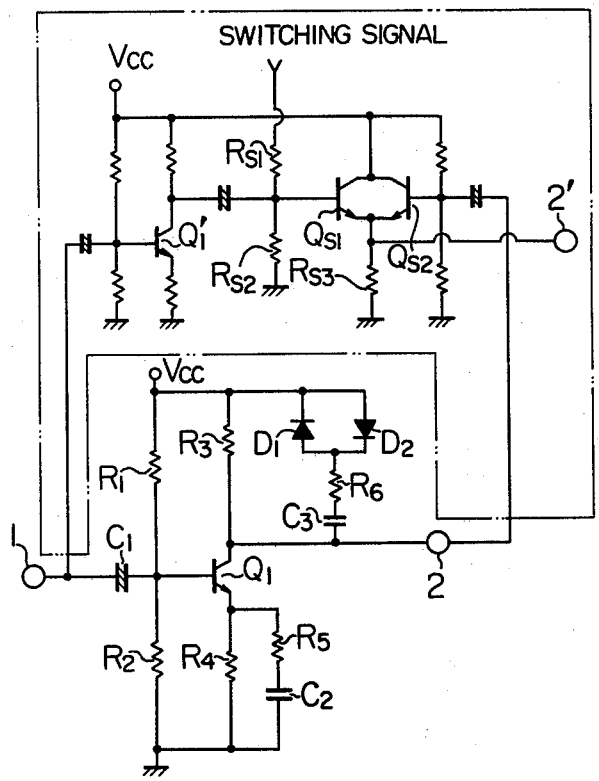
FIG. 1 is a circuit diagram showing a prior art non-linear emphasis circuit.

Exemplified in FIG. 1 is a circuit arrangement of a typical non-linear emphasis circuit of the prior art. Reference numerals 1 and 2 designate an input terminal and an output terminal, respectively. An amplifier transistor $Q_1$ has its base connected to the input terminal through a coupling capacitor $C_1$ and is given a base bias through the base also connected to a junction of resistors $R_1$ and $R_2$ constituting a series circuit connected between a power source $V_{cc}$ and ground. The transistor $Q_1$ has a collector load resistor $R_3$ and an emitter resistor $R_4$. Connected in parallel with the resistor $R_3$ is a series connection of inverse-parallel-connected diodes $D_1$ and $D_2$ and a series circuit comprised of a resistor $R_6$ and a capacitor $C_3$. Connected in parallel with the resistor $R_4$ is a series connection of a resistor $R_5$ and a capacitor $C_2$. The resistors $R_5$, $R_6$ and the capacitors $C_2$, $C_3$ are elements for substantially determining the frequency response or the frequency characteristics of this emphasis circuit. The diodes $D_1$ and $D_2$ are in electrical connection with the series circuit of the resistor $R_6$ and capacitor $C_3$ and cooperative with them to provide the emphasis with non-linearity.

Next, the operation of the emphasis circuit will be described in brief.

An emitter impedance $Z_E$ of the transistor $Q_1$ is first calculated and expressed as, $$Z_E = \frac{R_4(1 + j\omega C_2 R_5)}{1 + j\omega C_2 (R_4 + R_5)}$$

where $\omega$ represents an angular frequency. Accordingly, when the input signal is applied to the base of the transistor $Q_1$, frequency response of emitter current $i_e$ is, $$i_e \propto \frac{1}{Z_E} = \frac{1 + j\omega C_2 (R_4 + R_5)}{R_4 (1 + j\omega C_2 R_5)} \quad (1)$$

Figure 2:
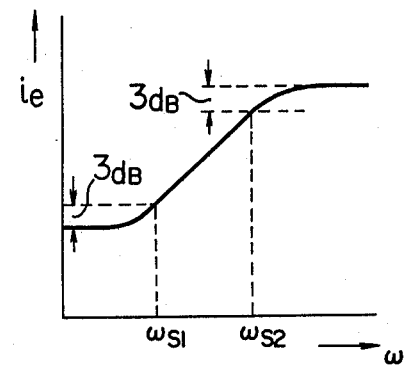
FIGS. 2 and 3 are graphs useful for explaining the operation of the circuit shown in FIG. 1.

The characteristic of the emitter current $i_e$ is then depicted graphically in FIG. 2, indicating that the emitter current $i_e$ adds 3 dB to its value for the lower frequency band at an angular frequency $\omega_{s1}$ which is, $$\omega_{s1} = \frac{1}{C_2 (R_4 + R_5)} \quad (2)$$

The value $i_{e\infty}$ of the emitter current $i_e$ for the higher frequency band in which the impedance of the capacitor $C_2$ is negligible is expressed as, $$i_{e\infty} \propto \frac{R_4 + R_5}{R_4 \cdot R_5} \quad (3)$$

Accordingly, the emitter current decreases by 3 dB from the value $i_{e\infty}$ at an angular frequency $\omega_{s2}$ which is, $$\omega_{s2} = \frac{1}{C_2 R_5} \quad (4)$$

On the other hand, a collector impedance $Z_C$ of the transistor $Q_1$ is $$Z_C = \frac{R_3 \{1 + j\omega C_3 (R_6 + R_D)\}}{1 + j\omega C_3 (R_3 + R_6 + R_D)} \quad (5)$$

where $\omega$ represents an angular frequency and $R_D$ represents a conduction resistance of the diodes $D_1$ and $D_2$ (a resistance of the diodes when they are conducting). Thus, when the diodes $D_1$ and $D_2$ are conducting with their conduction resistance $R_D$ deemed to be zero because of the input signal applied to the terminal 1 is sufficiently large to ignore this, $$Z_C = \frac{R_3 (1 + j\omega C_3 R_6)}{1 + j\omega C_3 (R_3 + R_6)} \quad (6)$$

holds. When $R_D=0$ with the input signal level sufficiently high, the collector impedance $Z_C$ decreases by 3 dB from its value for the lower frequency band at an angular frequency $\omega_{s3}$ which is, $$\omega_{s3} = \frac{1}{C_3 (R_3 + R_6)} \quad (7)$$

Also, when $R_D=0$ with the input signal level being sufficiently high, the value $Z_{C\infty}$ of the collector impedance for the higher frequency band is, $$Z_{C\infty} = \frac{R_3 R_6}{R_3 + R_6}$$

and the collector impedance adds 3 dB to the value $Z_C$ at an angular frequency $\omega_{s4}$ which is, $$\omega_{s4} = \frac{1}{C_3 R_6} \quad (8)$$

The overall characteristic of the non-linear emphasis circuit as shown in FIG. 1 is represented by a product of equation (1) indicative of the characteristic of the emitter current $i_e$ and equation (5) indicative of the characteristic of the collector impedance $Z_C$, so that when equation (6) is used to describe the characteristic of the collector impedance $Z_C$, that is, when the level of the input signal is usfficiently high and $R_D$ is deemed to be zero, an output $V_H$ developing at the output terminal 2 is, $$V_H \propto \frac{\{1 + j\omega C_2 (R_4 + R_5)\}}{R_4 (1 + j\omega C_2 R_5)} \cdot \frac{R_3 (1 + j\omega C_3 R_6)}{\{1 + j\omega C_3 (R_3 + R_6)\}} \quad (9)$$

Then, if $C_2 R_5 = C_3 R_6$ and $C_2 (R_4 + R_5) = C_3 (R_3 + R_6)$, i.e., $\omega_{s2} = \omega_{s4}$ and $\omega_{s1} = \omega_{s3}$ hold (these conditions hold in design for general purpose), $$V_H \propto \frac{R_3}{R_4} \quad (9')$$

stands and the output $V_H$ has a flat characteristic which is independent of the frequency.

Next, discussion will be directed to the case where $R_D$ is not zero with the input signal level not sufficiently high to ignore $R_D$. The collector impedance $Z_C$ of the transistor $Q_1$ reduces by 3 dB from its value for the lower frequency band at an angular frequency $\omega_{S5}$ which is, $$\omega_{S5} = \frac{1}{C_3 (R_3 + R_6 + R_D)} \quad (10)$$

and the collector impedance $Z_C$ for the higher frequency band is given by, $$Z_C = \frac{R_3 (R_6 + R_D)}{R_3 + R_6 + R_D}$$

The collector impedance adds 3 dB to the value $Z_{C\infty}$ at an angular frequency $\omega_{S6}$ which is, $$\omega_{S6} = \frac{1}{C_3 (R_6 + R_D)} \quad (11)$$

Accordingly, the overall characteristic for $R_D=0$ as denoted by $V_M$ has a value $V_{M\infty}$ for the higher frequency band which is represented by, $$V_{M\infty} \propto \frac{R_4 + R_5}{R_4 R_5} \cdot \frac{R_3 (R_6 + R_D)}{R_3 + R_6 + R_D} \quad (12)$$

since the emitter current $$i_{M\infty} \propto \frac{R_4 + R_5}{R_4 R_5}$$

and the collector impedance $$Z_{CM\infty} = \frac{R_3 (R_6 + R_D)}{R_3 + R_6 + R_D} \text{ stand.}$$

On the other hand, the overall characteristic $V_M$ has a value $V_{MO}$ for the lower frequency band which is represented by, $$V_{MO} \propto \frac{1}{R_4} \cdot R_3 \quad (13)$$

since the emitter current $$i_{eO} \propto \frac{1}{R_4}$$

and the collector impedance $Z_C = R_3$ stand.

When the input signal applied to the terminal 1 is small with the diodes $D_1$ and $D_2$ rendered non-conducting and $R_D = \infty$, the emitter current $i_e$ is on the one hand represented by equation (1) and the collector impedance on the other hand is represented by $Z_{CL} = R_3$, so that the overall characteristic as denoted by $V_L$ becomes, $$V_L \propto \frac{\{1 + j\omega C_2 (R_4 + R_5)\}}{R_4 (1 + j\omega C_2 R_5)} \cdot R_3 \quad (14)$$

which exhibits a frequency response that is determined by the emitter current $i_e$ of the transistor $Q_1$.

Figure 3:
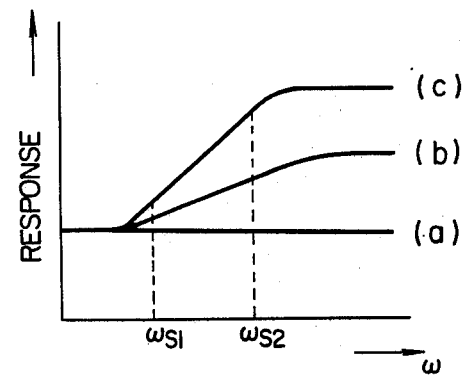

As described above, the overall characteristics defined by a product of equation (1) and equation (5) depend on the conduction resistance $R_D$ of the diodes $D_1$ and $D_2$, that is, the input level as will be seen from equation (1), (5), (9'), (12), (13) and (14) and the frequency response of the overall characteristics changes as shown in FIG. 3, responsive to a decrease of the level of input signal from a flat plot (a) corresponding to equation (9), to a plot (c) determined by values of $C_2$, $R_4$ and $R_5$ and corresponding to equation (14) via a plot (b) corresponding to the product of equation (1) and equation (5).

In this manner, the circuit as shown in FIG. 1 can provide non-linear emphasis characteristics and when used in home-use VTRs, it can considerably improve the signal-to-noise ratio in the long time recording mode.

With the aforementioned prior art non-linear emphasis circuit, design is partly easy in determining the transient frequencies $\omega_{s1}$ and $\omega_{s2}$ as shown in FIG. 3 but is partly very difficult in determining the input level versus frequency characteristic in respect of any plottings between the plots (a) and (c), for example, the plot (b) because each of the intermediate plottings is a function of $R_D$. As a result, it was inevitable that constants for the intermediate plottings were determined empirically.

In addition, the circuit section for determining the frequency characteristics includes the non-linear elements such as diodes $D_1$ and $D_2$ which are responsible for generation of harmonic distortion. Especially, the level of harmonics increases correspondingly with the increase of the input level and the thus increased level of harmonics is directly coupled to the output of the circuit, thereby affecting picture quality adversely.

Reverting further to FIG. 1, a switching circuit is seen which is contoured by chain lines. This switching circuit is adapted to make exertion of the non-linear emphasis invalid during operation in the normal recording mode and includes a transistor $Q_1'$ which receives and amplifies a part of the input signal applied to the input terminal 1. A pair of transistors $Q_{s1}$ and $Q_{s2}$ have emitters connected in common and collectors also connected in common, the common collectors being connected to the power source $V_{CC}$ and the common emitters being connected to ground via an emitter resistor $R_{s3}$. The transistor $Q_{s2}$ has its base connected to receive an output signal having been subjected to an emphasis and fed from the collector of the transistor $Q_1$. The transistor $Q_{s1}$ has its base connected to the junction in a series-connected resistors $R_{s1}$ and $R_{s2}$ so as to receive a switching signal. The transistor $Q_{s1}$ also receives at its base the output of the transistor $Q_1'$. The transistor pair $Q_{s1}$ and $Q_{s2}$ act as a switch in such a manner that each of the transistors $Q_{s1}$ and $Q_{s2}$ becomes conducting when receiving a base voltage higher than that of the other transistor and becomes non-conducting when receiving a base voltage lower than that of the other transistor. When a switching signal is applied to the base of the transistor $Q_{s1}$ in the normal recording mode such that the base voltage of the transistor $Q_{s1}$ is higher than that of the transistor $Q_{s2}$, the transistors $Q_{s1}$ and $Q_{s2}$ become conducting and non-conducting, respectively. As a result, the input signal supplied to the input terminal 1 is amplified by the transistor $Q_1'$ and the amplified signal without being subjected to any emphasis is delivered through the transistor $Q_{s1}$ to the output terminal 2'. Meanwhile, in the absence of the switching signal in the long time recording mode, the base of the transistor $Q_{s1}$ is at the ground potential which is lower than the base voltage of the transistor $Q_{s2}$, so that the transistors $Q_{s1}$ and $Q_{s2}$ become non-conducting and conducting, respectively. As a result, the output of the transistor $Q_1$ having been subjected to a non-linear emphasis is delivered through the transistor $Q_{s2}$ to the output terminal 2'. As will be seen from the above, the switching circuit required for the selective invalidation of non-linear emphasis for the normal recording mode is complicated.

It is here to be pointed out that the resistors $R_5$, $R_6$ and the capacitors $C_2$, $C_3$ for determining the frequency characteristics are required to have highly accurate circuit constants, and therefore these elements must be applied as externally provided or attached elements to a circuit produced in an IC form, resulting in an increased number of pins for the circuit and an increased number of peripheral parts. This disadvantage is aggravated by the complicated switching circuit arrangement, making it inconvenient to make the circuit integrated.

The principle of the present invention will be best understood from FIG. 4 which illustrates, in schematic block form, one embodiment of the invention wherein reference numeral 1 designates a signal input terminal, 2 a signal output terminal, 3 a high-pass filter (hereinafter simply referred to as HPF) supplied with an input signal and producing an output to be applied to a compressor 4, and 5 an adder adapted to add the input signal applied to the terminal 1 and an output of the compressor 4 to thereby produce an emphasized output.

Figure 5:
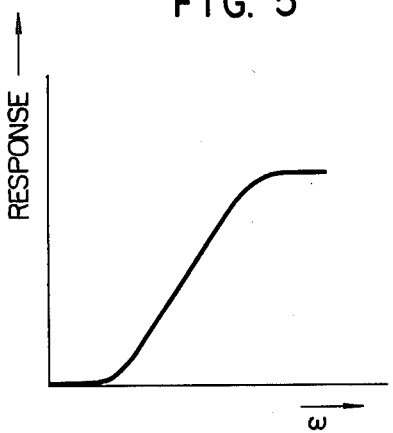
FIGS. 5 through 8 are graphs useful for explaining the operation of the circuit shown in FIG. 4.
Figure 6:
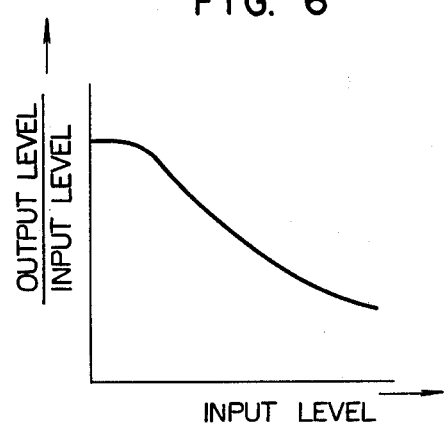
Figure 7:
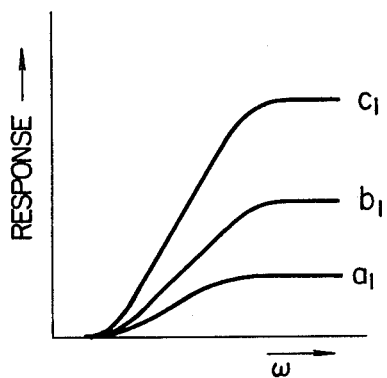
Figure 8:
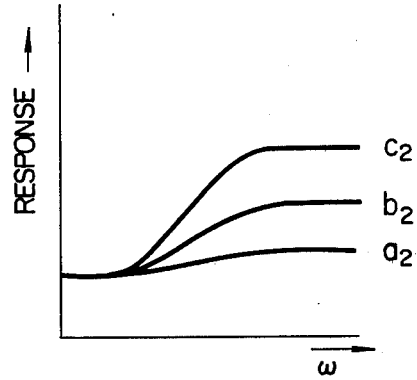

FIG. 5 shows a frequency characteristic or response of the HPF 3 and FIG. 6 shows an input level versus output level/input level characteristic of the compressor 4. As shown in FIG. 6, in the compressor 4, the output level/input level (i.e., gain) relative to the amplitude level of the input signal has a tendency to decrease and increase responsive to an increase and a decrease of the input signal level, respectively, and the output level of the compressor 4 has a constant value responsive to the input signal at a level higher than a predetermined level. Consequently, the overall characteristic accruing from the FIG. 5 characteristic of HPF 3 and the FIG. 6 characteristic of compressor 4 is a resultant characteristic as shown in FIG. 7. Curves $c_1$, $b_1$ and $a_1$ in FIG. 7 correspond to low, medium and high levels of the input signal, respectively. Further, the output of the compressor 4 is attenuated to a suitable level and fed to the adder 5 for addition with the original input signal. Then, frequency characteristics as shown in FIG. 8 are obtained at the output terminal 2. Curves $c_2$, $b_2$ and $a_2$ in FIG. 8 correspond to low, medium and high levels of the input signal, respectively.

Figure 4:
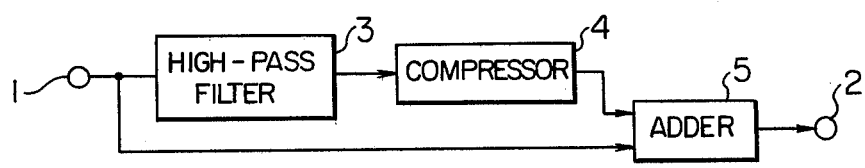
FIG. 4 is a block diagram showing schematic construction of a non-linear emphasis circuit embodying the invention.

It will be seen from the characteristics in FIG. 8 that the circuit shown in FIG. 4 provides a non-linear emphasis characteristic.

Figure 9:
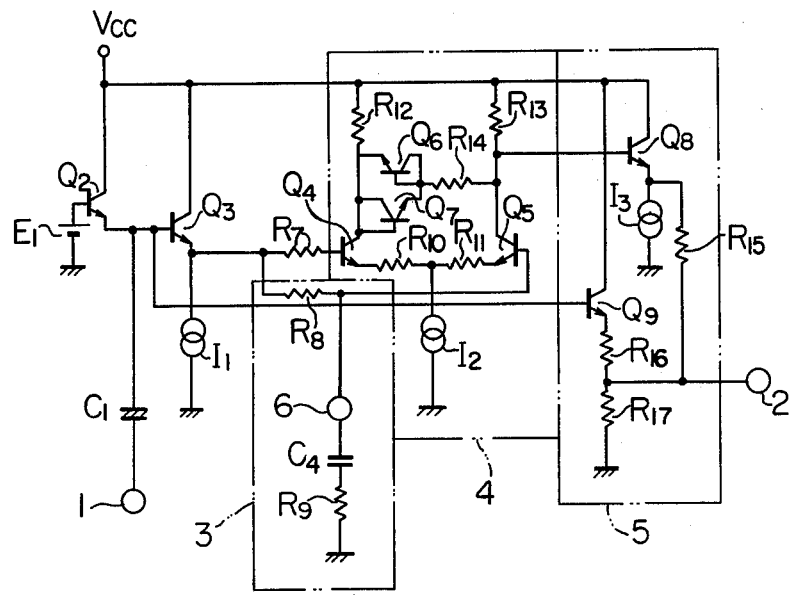

FIG. 9 shows an embodiment of the invention adapted for production in an IC form. In the figure, an input terminal, an output terminal, an HPF, a compressor, and an adder are interconnected as in FIG. 4 and like parts and designated by like reference numerals.

As shown in FIG. 9, an input signal is applied via an input terminal 1 and a coupling capacitor $C_1$ to a junction of an emitter of a clamping transistor $Q_2$ and the base of a buffer transistor $Q_3$. The HPF 3 includes a series connection of resistors $R_9$, $R_8$ and a capacitor $C_4$. The compressor 4 includes transistors $Q_4$, $Q_5$ constituting a differential amplifier and a series circuit connected between the collectors of the two transistors and comprised of a resistor $R_{14}$ and transistors $Q_6$, $Q_7$ in diode connection. The transistors $Q_6$ and $Q_7$ are connected in an inverse-parallel relationship. A resistor $R_{12}$ is connected between the collector of the transistor $Q_4$ and the power source $V_{cc}$, and a resistor $R_{13}$ is connected between the collector of the transistor $Q_5$ and the power source $V_{cc}$. The emitter of the transistor $Q_6$ and the collector and the base of the transistor $Q_7$ are commonly connected to the collector of the transistor $Q_4$. The base and the collector of the transistor $Q_6$ and the emitter of the transistor $Q_7$ are commonly connected to one end of the resistor $R_{14}$ which is connected, at the other end, to the collector of the transistor $Q_5$. The emitters of the transistors $Q_4$ and $Q_5$ are commonly connected to a constant current source $I_2$ via resistors $R_{10}$ and $R_{11}$, respectively. The base of the transistor $Q_4$ is connected to one end of a resistor $R_7$ which is connected, at the other end, to the emitter of the buffer transistor $Q_3$ whose output is taken out of the emitter, and the base of the transistor $Q_5$ is connected to the junction of the resistor $R_8$ and the capacitor $C_4$. The other end of the resistor $R_8$ is connected to the emitter of the buffer transistor $Q_3$. The adder 5 includes a transistor $Q_8$ having its base connected to the collector of the transistor $Q_5$, its collector connected to the power source $V_{cc}$, and its emitter connected to a current source $I_3$ and one end of a resistor $R_{15}$; a transistor $Q_9$ having its base connected to the input terminal 1 via the coupling capacitor $C_1$, its collector connected to the power source $V_{cc}$, and its emitter connected to one end of a resistor $R_{16}$; the resistors $R_{15}$ and $R_{16}$ having their other ends connected in common to the output terminal 2; and a resistor $R_{17}$ connected between the other end of the resistor $R_{16}$ and ground. Also connected to the emitter of the buffer transistor $Q_3$ is a current source $I_1$. A base bias source $E_1$ is provided for the clamping transistor $Q_2$. Reference numeral 6 denotes an external terminal. In FIG. 9, all but coupling capacitor $C_1$, capacitor $C_4$ of the HPF 3 and resistor $R_9$, which are connected exteriorly of the circuit, can be integrated.

The operation of this circuit will be described hereunder.

A video signal received at the input terminal 1 is applied via the capacitor $C_1$ to the emitter of the clamping transistor $Q_2$ and to the bases of the buffer transistors $Q_3$ and $Q_9$, and sync tip voltage is fixed at $E_1 - V_{BE2}$, where $V_{BE2}$ is the base/emitter voltage of the transistor $Q_2$. The signal from the emitter of the buffer transistor $Q_3$ is fed via the resistor $R_7$ to the base of the transistor $Q_4$ and is also fed to the base of the transistor $Q_5$ via the resistor $R_8$. Since the base of the transistor $Q_5$ is grounded through the capacitor $C_4$ and resistor $R_9$, the input signal to the base of the transistor $Q_5$ is given an LPF characteristic which is determined by the resistors $R_8$, $R_9$ and capacitor $C_4$. But the input signal as received by the differential amplifier comprised of the transistors $Q_4$ and $Q_5$ is given the HPF characteristic as depicted in FIG. 5. In particular, it is to be noted that the HPF 3 has a time constant represented by $C_4$ ($R_8 + R_9$) and hence the HPF characteristic has no substantial dependency on the level of input signal or is insensible to input signal level changes. In other words, the HPF 3 excludes any elements whose circuit constants are variable with the level of input signal, making it possible to provide easiness of circuit design.

On the other hand, assuming that the dynamic resistance of the transistors $Q_6$ and $Q_7$ in diode connection is $R_D$ and $R_{12} = R_{13}$ stands, the collector load of the differential amplifier ($Q_4$, $Q_5$) as designated by $Z_{Cl}$ is, $$Z_{Cl} = \frac{R_{12} \cdot \frac{(R_D + R_{14})}{2}}{R_{12} + \frac{(R_D + R_{14})}{2}} \quad (15)$$

For high signal levels, $R_D << R_{14}$ stands and $$Z_{Cl} = \frac{R_{12} \cdot \frac{R_{14}}{2}}{R_{12} + \frac{R_{14}}{2}} \quad (16)$$

is obtained. In response to the decrease of the input signal level, $Z_{Cl}$ approaches to equation (15). As the input signal level further decreases, the diode connection transistors $Q_6$ and $Q_7$ are turned off and, $$Z_{Cl} = R_{12} \quad (17)$$

is obtained. Accordingly, the compressor 4 can have the characteristic as shown in FIG. 6 by making use of the $Z_{Cl}$ characteristic set forth as above. It is to be noted that all the elements for determination of $Z_{Cl}$ have circuit constants substantially independent of the frequency or insensible to frequency changes as will be seen from the above explanation and hence the gain of the compressor 4 has no substantial dependency on the frequency.

The output of the compressor 4 is sent via the buffer transistor $Q_8$ to the adder 5 and added to the original video signal fed from the buffer transistor $Q_9$ at a predetermined rate, that is, at a predetermined adding rate. The adding rate is determined by resistances of the resistors $R_{15}$ and $R_{16}$ and expressed as a voltage adding rate of $v_i R_{15} : v_c R_{16}$ where $v_i$ represents the original signal and $v_c$ the output of the compressor. For example, in order to obtain a degree of emphasis of 6 dB with the input signal level being decreased by about 20 dB, the adding rate is set to be 1:1. Accordingly, in order to obtain a 6 dB emphasis for the higher frequency band when the input signal level decreases by 20 dB under the condition that the compressor output is 1 $V_{p-p}$ and 0 dB of the output signal corresponds to 1 $V_{p-p}$, the rate $R_{15}/R_{16}$ is required to be 10/1. On the other hand, when the input level is 0 dB and sufficiently large, the level of the compressor output $v_c$ remains also almost unchanged and to cause the output of the compressor fed to the adder to be negligible relative to the input signal $v_i$, giving rise to substantial invalidation of the emphasis. As a result, the characteristic as shown in FIG. 8 is obtained at the output terminal 2 and the non-linear emphasis circuit is established.

In the embodiment as shown in FIG. 9, since externally provided terminals are required only for the input terminal 1, output terminal 2 and external terminal 6 for lead of the RC series circuit in HPF 3 and the number of peripheral parts is reduced, this embodiment can be adapted for production in an IC form.

FIG. 10 shows another embodiment of the invention which is different from the FIG. 9 embodiment only by the provision of an HPF 3 having a substantially different construction from that of the HPF in the FIG. 9 embodiment. More particularly, a series connection of a capacitor 24 and a resistor 29 is connected between an input terminal 1 and the base of the transistor $Q_4$, especially, the capacitor side end of the series circuit being coupled with the input terminal 1 and the resistor side end being coupled with the base of the transistor $Q_4$ via an external terminal 6. An input signal received at the input terminal 1 is applied on the one hand to the base of the transistor $Q_4$ included in the compressor 4 via the capacitor $C_{24}$, resistor $R_{29}$ and external terminal 6. The base of the transistor $Q_4$ is also connected to the emitter of the transistor $Q_3$ via a resistor $R_{27}$. It will be appreciated that in this embodiment the junction of a resistor $R_{28}$ and the base of the transistor $Q_5$ has no branch. The capacitor $C_{24}$ and the resistors $R_{29}$ and $R_{27}$ constitute the HPF 3 having a time constant of $C_{24}(R_{27}+R_{29})$. The input signal is applied on the other hand to the base of the transistor $Q_9$ via the capacitor $C_1$ and added to an output signal of the compressor 4 at the adder 5. A base bias source $E_2$ is provided for the buffer transistor $Q_3$.

By making equal the time constant of the HPF to that of the FIG. 9 embodiment, this embodiment of FIG. 10 can provide the same characteristic as that of the FIG. 9 embodiment.

FIG. 11 shows still another embodiment which is identical with the FIG. 9 embodiment except for an additional switching circuit 7 adapted to on-off switch the non-linear emphasis between normal recording and long time recording modes, and a switching signal input terminal 8. The switching circuit 7 has such an extremely simplified circuit arrangement as has a switching transistor $Q_{10}$ with its collector connected to a resistor $R_9$ and its emitter grounded, and a resistor $R_{18}$ connected to the base of the transistor $Q_{10}$. The collector of the transistor $Q_{10}$ is coupled to the external terminal 6 via the resistor $R_9$ and the capacitor $C_4$. A switching signal received at the switching signal input terminal 8 is applied to the base of the transistor $Q_{10}$ via the resistor $R_{18}$. During the long time recording mode operation, a D.C. voltage sufficient to turn on the transistor $Q_{10}$ is fed to the switching signal input terminal 8. In this case, since the collector impedance of the transistor $Q_{10}$ as viewed from the resistor $R_9$ is very small and hence the resistor $R_9$ is equivalently grounded, the non-linear emphasis as described with reference to FIG. 9 is exerted. During the normal recording mode operation, on the other hand, the switching signal input terminal 8 is brought into ground potential. In this case, the collector impedance of the transistor $Q_{10}$ as viewed from the resistor $R_9$ is very large and hence the collector is deemed to be opened. As a result, the bases of transistors $Q_4$ and $Q_5$ constituting the differential amplifier are supplied with identical signals so that no signal appears at the collector of the differential amplifier. Because of the absence of an adding signal from a compressor 4, the non-linear emphasis is not effected and an original signal per se appears at the output terminal 2.

Reverting to FIG. 10, the switching circuit 27 is seen which has substantially the same construction as the corresponding circuit in FIG. 11. This switching circuit of FIG. 10 includes a transistor $Q_{20}$ with its collector connected to the resistor 29 via a capacitor $C_{20}$ and its emitter grounded, and a resistor 38 connected between the base of the transistor $Q_{20}$ and a switching signal input terminal 8. When the transistor $Q_{20}$ is turned on by a switching signal, the junction of the resistor $R_{29}$ included in the HPF 3 and the transistor $Q_4$ included in the compressor 4 is AC-wise grounded and accordingly, the output of the compressor falls to zero. On the other hand, when the transistor $Q_{20}$ is non-conductive, the switching circuit 27 is electrically isolated from the HPF 3, thereby making the emphasis valid.

As described above, according to the present invention, the frequency characteristic is determined by only the time constant of the HPF comprised only of passive elements other than non-linear elements and the adding rate of the adder, thereby assuring easiness of circuit design as compared with the prior art. Further, when the input signal level is high, the adding rate of the compressor output signal predominantly containing harmonic distortion is reduced and consequently, the harmonic level in the output signal is minimized, thus assuring a minimal degradation of picture quality. Furthermore, the non-linear emphasis circuit can be adapted for production in an IC form with reduction in the number of pins and peripheral parts.

We claim:

1. A non-linear emphasis circuit capable of effecting an emphasis the degree of which is variable depending on the level of an input signal to the emphasis circuit, comprising:
   a high-pass filter for receiving an input signal;
   a compressor arranged to be supplied with the output of said high-pass filter, the gain of said compressor being variable responsive to the output of said high-pass filter and having a tendency to decrease and increase responsive to an increase and a decrease of the output of said high-pass filter, respectively;
   an adder arranged to be supplied with said input signal and the output of said compressor and having means for adding them at a predetermined rate for producing an emphasized output signal; and
   a switching circuit in electrical connection with said high-pass filter for disabling the latter.

2. A non-linear emphasis circuit capable of effecting an emphasis the degree of which is variable depending on the level of an input signal to the emphasis circuit, comprising:
   a high-pass filter for receiving an input signal;
   a compressor arranged to be supplied with the output of said high-pass filter, the gain of said compressor being variable responsive to the output of said high-pass filter and having a tendency to decrease and increase responsive to an increase and a decrease of the output of said high-pass filter, respectively; and
   an adder arranged to be supplied with said input signal and the output of said compressor and having means for adding them at a predetermined rate for producing an emphasized output signal,
   wherein said compressor includes a differential amplifier having first and second transistors and a series connection of a resistor and inverse-parallel-connected diode elements between the collectors of said transistors, and said high-pass filter includes a filter network in electrical connection with one of said transistors.

3. A non-linear emphasis circuit according to claim 2, further comprising a switching circuit in electrical connection with said high-pass filter for disabling the latter.

4. A non-linear emphasis circuit capable of effecting an emphasis the degree of which is variable depending on the level of an input signal to the emphasis circuit, comprising:
   a high-pass filter for receiving an input signal;
   a compressor arranged to be supplied with the output of said high-pass filter, the gain of said compressor being variable responsive to the output of said high-pass filter and having a tendency to decrease and increase responsive to an increase and a decrease of the output of said high-pass filter, respectively; and an adder arranged to be supplied with said input signal and the output of said compressor and having means for adding them at a predetermined rate for producing an emphasized output signal, wherein said high-pass filter has a frequency response substantially insensible to changes of the level of said input signal, while said compressor has said gain substantially insensible to changes of the frequency of the output of said high-pass filter, and wherein said compressor includes a differential amplifier having first and second transistors and a series connection of a resistor and inverse-parallel-connected diode elements between the collectors of said transistors, and said high-pass filter includes a filter network in electrical connection with one of said transistors.

5. A non-linear emphasis circuit according to claim 4, further comprising a switching circuit in electrical connection with said high-pass filter for disabling the latter.

6. A non-linear emphasis circuit according to claim 2 or 4, wherein said high-pass filter includes a series circuit of a capacitor and a resistor, one end of said series circuit being connected with one of said transistors in said compressor circuit through an external connection pin.

7. A non-linear emphasis circuit for video recording signals in a video tape recording system capable of effecting an emphasis on said video recording signals, the degree of which emphasis is variable depending on the level of an input video recording signal to the emphasis circuit, comprising:

a high-pass filter for receiving an input video recording signal;

a compressor arranged to be supplied with the output of said high-pass filter, the gain of said compressor being variable responsive to the output of said high-pass filter and having a tendency to decrease and increase responsive to an increase and a decrease of the output of said high-pass filter, respectively; and an adder arranged to be supplied with said input video recording signal and the output of said compressor and having means for adding them at a predetermined rate for producing an emphasized output video recording signal, wherein the degree of emphasis decreases as the input video recording signal level increases.

8. A non-linear emphasis circuit according to claim 7, in which said high-pass filter has a frequency response substantially insensible to changes of the level of said input video recording signal, while said compressor has said gain substantially insensible to changes of the frequency of the output of said high-pass filter.

9. A non-linear emphasis circuit according to claim 7 or 8, in which said compressor includes a differential amplifier having first and second transistors and a series connection of a resistor and inverse-parallel-connected diode elements between the collectors of said transistos, and said high-pass filter includes a filter network in electrical connection with one of said transistors.

10. A non-linear emphasis circuit according to claim 7, wherein said video tape recording system has at least a normal recording mode and a long time recording mode, said circuit further comprising a switching circuit in electrical connection with said high-pass filter for disabling the latter when said video tape recording system is in said normal recording mode and for enabling said high-pass filter when said video tape recording system is in said long time recording mode.

11. A non-linear emphasis circuit according to claim 9, wherein said high-pass filter includes a series circuit of a capacitor and a resistor, one end of said series circuit being connected with one of said transistors in said compressor circuit through an external connection pin.

* * * * *